(12) United States Patent
Goettsche et al.

(10) Patent No.: US 7,147,388 B2
(45) Date of Patent: Dec. 12, 2006

(54) METHOD FOR FABRICATION OF AN ALL FIBER POLARIZATION RETARDATION DEVICE

(75) Inventors: Randy P. Goettsche, Phoenix, AZ (US); Karl A. Fetting, Glendale, AZ (US); Glen A. Sanders, Scottsdale, AZ (US); John H. Shannon, Scottsdale, AZ (US); Tracy L. Hawk, Phoenix, AZ (US)

(73) Assignee: NxtPhase Corporation, Vancouver (CA)

( * ) Notice: Subject to any disclaimer, the term of this patent is extended or adjusted under 35 U.S.C. 154(b) by 806 days.

(21) Appl. No.: 10/321,752

(22) Filed: Dec. 16, 2002

(65) Prior Publication Data

US 2003/0138224 A1   Jul. 24, 2003

Related U.S. Application Data

(62) Division of application No. 09/222,411, filed on Dec. 29, 1998, now Pat. No. 6,535,654.

(51) Int. Cl.
*G02B 6/255* (2006.01)

(52) U.S. Cl. .............................. 385/95; 385/11; 385/136

(58) Field of Classification Search ............ 385/11–14, 385/31, 50, 95, 136
See application file for complete search history.

(56) References Cited

U.S. PATENT DOCUMENTS 5,377,283 A  * 12/1994  Blake et al. ................. 385/11
5,587,791 A  * 12/1996  Belleville ................... 356/345

* cited by examiner

*Primary Examiner*—Frank G. Font
*Assistant Examiner*—Michael P. Mooney
(74) *Attorney, Agent, or Firm*—Robert A. Pajak

(57) ABSTRACT

The polarization state of a light wave is changed by a fiber polanrzation retardation device constructed by a method including employment of a pair of clamping fixtures, and a series of steps including clamping, cleaving, splicing, releasing, clamping, and cleaving, so as to achieve precise optical fiber lengths to achieve a desired polarization retarding device.

1 Claim, 5 Drawing Sheets

METHOD FOR FABRICATION OF AN ALL FIBER POLARIZATION RETARDATION DEVICE

This is a division of prior patent application having Ser. No. 09/222,411 filed on Dec. 29, 1988 now U.S. Pat No. 6,535,654 entitled, "METHOD FOR FABRICATION OF AN ALL FIBER POLARIZATION RETARDATION DEVICE."

TECHNICAL FIELD OF THE INVENTION

The present invention generally relates to current sensors. More particularly, the present invention relates to a method for polarization state conversion of an electromagnetic wave.

BACKGROUND OF THE INVENTION

Magnetic fields interact with circularly-polarized light waves propagating through optical fiber under a principle known as the magneto-optic Faraday effect. Under this principle, a magnetic field will rotate the plane of polarization of circularly-polarized light waves traveling in opposite directions and thereby cause a phase shift to occur between the relative phases of the two light waves. This phase shift is known as a non-reciprocal phase shift. For example, in a fiber optic current sensing coil affected by a magnetic field, where a first light wave, having a circular polarization state, travels in one direction in the coil and a second light wave having a circular polarization state travels in the opposite direction, there will be a phase shift between the two waves called non-reciprocal phase shift. The non-reciprocal phase shift experienced by a light wave will vary depending on whether the light wave is propagating in the same direction as the magnetic field or against the magnetic field. Measurements of the non-reciprocal phase shift may then be made to determine current or magnetic fields affecting the sensing coil.

Because the non-reciprocal phase shift occurs between light waves in a circular polarization state and because the light waves are initially in a linear polarization state, a method for converting the polarization state of a light wave is needed. To convert a light wave, e.g., vector E, having an x-axis component, Ex, and a y-axis component, Ey, from a linear polarization state to circular polarization state, the wave is passed through a highly birefringent medium. A birefringent medium is a medium that has two different indices of refraction, e.g., nx and ny. Each index of refraction corresponds to a different polarization axis where the axes are orthogonal to each other. For example, nx may correspond to an x-axis and ny may correspond to a y-axis. Because of the different refraction indices, Ex will travel at a different speed than Ey. Assuming that Ex and Ey enter the birefringent medium in phase with respect to one another, the phase difference between the components, $\phi$, at the output of the birefringent medium is as follows:

$$\phi = 2\pi \frac{(n_x - n_y) * d}{\lambda} \text{rad} = 360 \frac{(n_x - n_y) * d}{\lambda} \text{degrees}$$

where d is the length of the birefringent medium and is the wavelength of the light wave. Thus, the phase difference between an x-axis component and a y-axis component of a light wave traveling through a birefringent medium equals the difference between the indices of refraction multiplied by the length of the birefringent medium and divided by the wavelength of the light wave.

As shown in the formula, the change of polarization state is periodic through the birefringent medium. When the phase difference between Ex and Ey changes from 0 rad (0°) to /4 rad (90°), the polarization state of E changes from linear to circular when Ex and Ey are equal in magnitude.

In addition, the change of polarization state is directly proportional to the length of the birefringent medium. With all other variables being constant, the length of the birefringent medium dictates the phase difference. The relationship between one wavelength of a given frequency of light and the length of the birefringent medium is referred to as the birefringence beat length, $\Lambda$ where $$\Lambda = \frac{\lambda}{n_x - n_y}.$$

Thus, the beat length equals the wavelength divided by the difference between the indices of refraction of the birefringent medium. In other words, the physical length corresponding to one beat length of a birefringent medium corresponds to $2\pi$ of phase shift of the light passing through that medium.

One type of birefringement medium that is typically used is know as a quarter-wave plate. One of the effects of a quarter-wave plate is to change the polarization state of a light wave from a linear polarization state to a circular polarization state. The length of a quarter-wave plate is such that components of a light wave are 90° out of phase with respect to one another upon exiting the quarter-wave plate. In particular, when a light wave is in a linear state of polarization being oriented at 45° from its principal axes, i.e., having equal components on its principal axes, and is input into a quarter-wave plate, the output is the light wave in a circular state of polarization. In a quarter-wave plate, d can be determined as follows:

$$d = \Lambda \frac{(2m+1)}{4}$$

where m is an integer, including zero. Therefore, the length d of a birefringent quarter-wave plate is one quarter or three quarters of the beat length $\Lambda$ longer than an integral number of beat lengths.

Previously, other methods have been used to convert between linear polarization states and circular polarization states. One such method uses a bulk optic quarter-wave retarder. In the case of a bulk optic device or crystal, a linearly-polarized light wave travels from a first optical fiber through a lens to collimate the light wave. The light wave then travels through a bulk optic crystal having principal axes oriented orthogonally with respect to each other and oriented at 45° with respect to the principal axes of the optical fiber. The wave then travels through a second lens and into a second optical fiber. This method is relatively costly, complex and its components occupy a relatively large amount of space. In addition, bulk optic devices are not reliable over time and temperature.

An alternate method includes the use of a single mode non-polarization maintaining fiber loop. The size and orientation of the loop converts a linear polarization state of a light wave into a circular polarization state. However, the single mode fiber loop may be hard to manipulate in achieving a desired orientation and its performance tends to degrade with temperature changes.

Thus, there is a need for a method which converts the polarization state of a light wave which eliminates or substantially reduces the disadvantages associated with prior methods.

BRIEF DESCRIPTION OF THE DRAWING

A more complete understanding of the present invention may be derived by referring to the detailed description and claims when considered in connection with the Figures, wherein like reference numbers refer to like items throughout the Figures, and:

DETAILED DESCRIPTION

The present invention is useful in all optics applications in which a change of polarization state of a light wave is desirable. The present invention utilizes an all-fiber polarization retarder which uses a high birefringent polarization-maintaining fiber to retard the polarization of a component of a light wave, or in other words, to change the polarization state of a light wave. An all-fiber polarization retarder is advantageous over prior devices because it is smaller, simpler, less expensive and more reliable. For exemplary purposes, the present invention is being described in a fiber optic current sensor application. In a fiber optic current sensor, the present invention provides an inexpensive and simple method to change the polarization state of a light wave, thereby allowing current and magnetic fields experienced by a sensing coil to be measured as a result of the magneto-optic Faraday effect.

Figure 1:
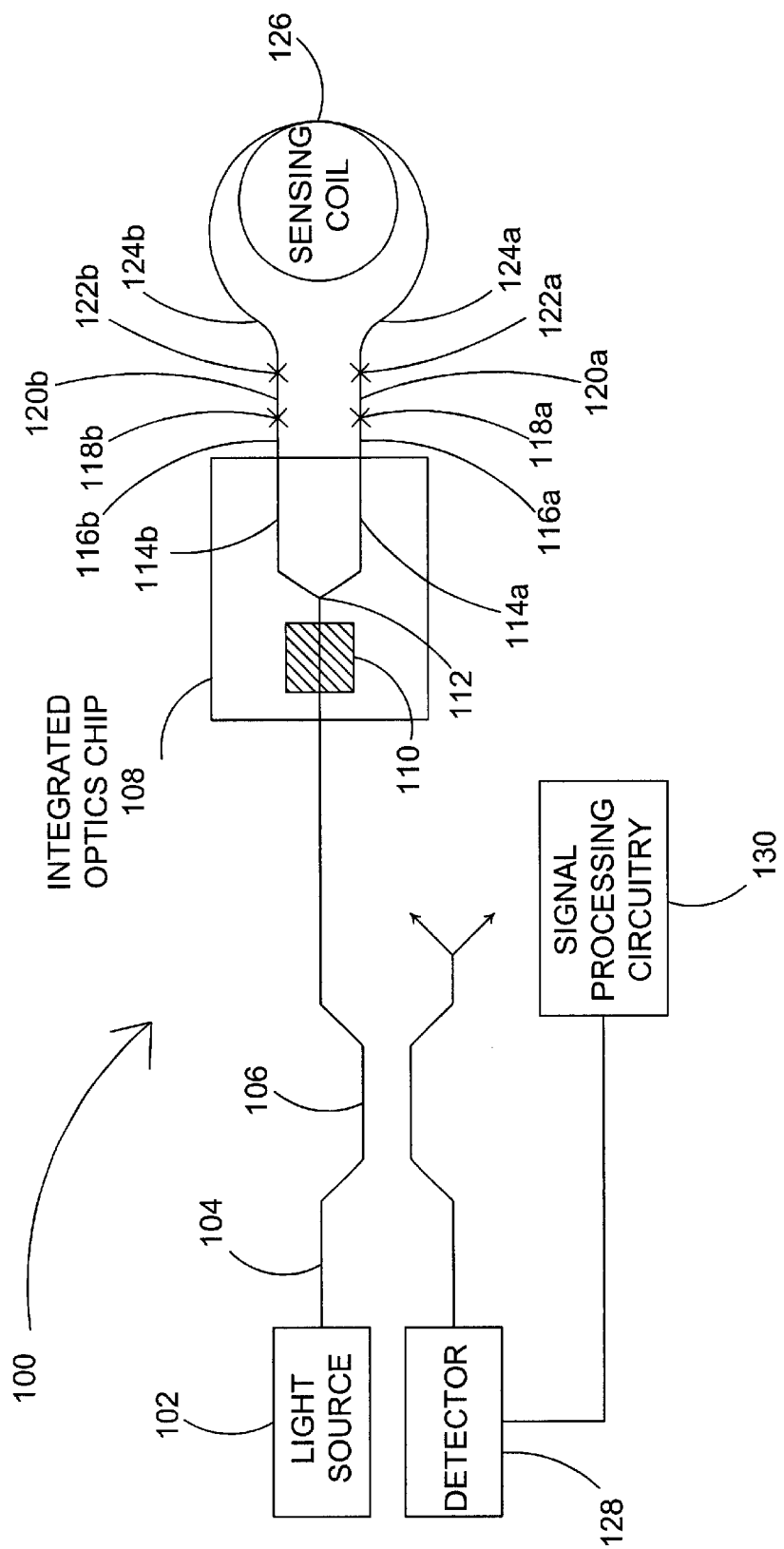
FIG. 1 shows a schematic of a fiber optic current sensor having an all fiber polarization retardation device.

FIG. 1 shows a general fiber optic current sensor schematic. Fiber optic current sensor 100 includes a light source 102, a coupler 106, an integrated optics chip 108 having a polarizer 110 and a beam splitter 112, a sensing coil 126, a detector 128 and signal processing circuitry 130. In operation, an electromagnetic wave, or light wave, travels from light source 102 along an optical fiber 104 into a coupler 106. Coupler 106 serves as a light wave splitter or beam splitter. The light wave entering coupler 106 from light source 102 is split into two light waves traveling in the same direction but exiting through separate ports. The light wave then travels into an integrated optics chip 108 where the light wave is linearly polarized by a polarizer 110 and split by a light wave splitter or beam splitter 112. Beam splitter 112 splits the light wave into two light waves 114a and 114b. Light waves 114a and 114b exit integrated optics chip 108 through fibers 116a and 116b and propagate through retardation fibers 120a and 120b which are connected to fibers 116a and 116b at splices 118a and 118b respectively. Light waves 114a and 114b change polarization states from linear to circular while propagating through retardation fibers 120a and 120b. Light waves 114a and 114b then propagate into fiber ends 124a and 124b of a tightly wound cylindrical structure of optical fiber known as a sensing coil 126 which are connected to retardation fibers 120a and 120b via splices 122a and 122b respectively. Light waves 114a and 114b, which are circularly polarized, counterpropagate through coil 126 and exit coil 126 through opposite ends 124b and 124a respectively from which the) entered. If coil 126 is effected by a magnetic field, a phase shift will occur between the phases of light waves 114a and 114b as they travel through coil 126.

Light waves 114a and 114b then re-travel part of the path from which they came. Light waves 114a and 114b interfere with each other at beam splitter 112 resulting in a light interference wave in accordance with well-known principles of optics. Some of the returning light interference wave is diverted by coupler 106 into detector 128. Detector 128 converts the light interference wave into the electrical domain where it can be analyzed to determine current, magnetic field strength, etc.

A phase shift between light waves 114a and 114b which is induced by a magnetic field will occur if light waves 114a and 114b are in circular polarization states. Thus, to enable the measurement of a phase shift between light waves 114a and 114b, they may need to be converted from a linear polarization state to a circular polarization state prior to entering coil 126. In a typical fiber optic current sensor, light waves 114a and 114b are linearly polarized by polarizer 110 as discussed above. The propagation of light waves 114a and 114b through retardation fibers 120a and 120b having a high birefringence converts the polarization state of light waves 114a and 114b. A high birefringent fiber has two dominant indices of refraction, suitably largely differing in value, which affect the propagation of a light wave through the fiber. The birefringent medium causes one component of the light wave to propagate more slowly, corresponding to the higher refractive index, than the other component of the light wave, corresponding to the lower refractive index.

Figure 2:
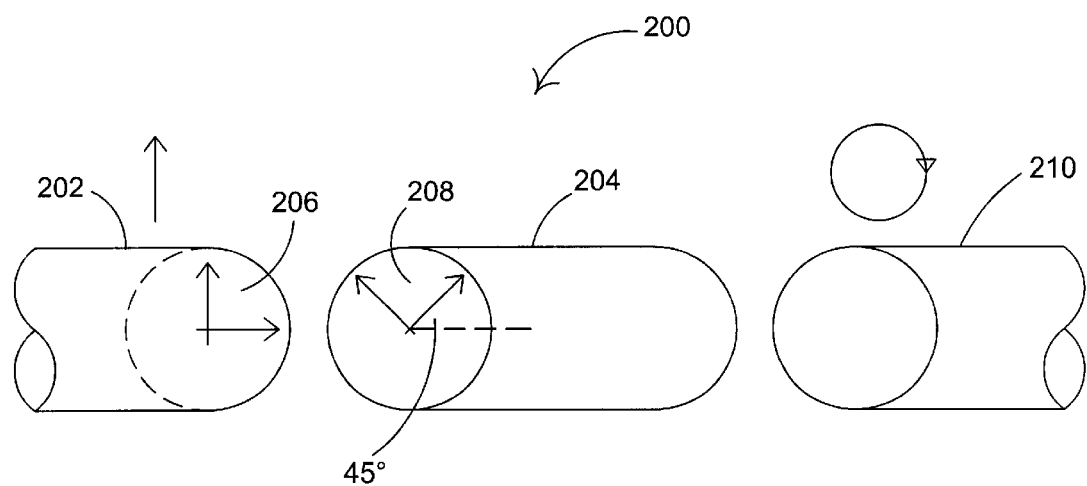
FIG. 2 shows a partial cross section of a polarization-maintaining retardation fiber with its principal axes oriented at 45° (relative to the principal axes of the polarization-maintaining input fiber)

FIG. 1 shows high birefringent polarization-maintaining retardation fibers 120a and 120b connected to linearly polarization-maintaining input fibers 116a and 116b via splices 118a and 118b respectively. An exemplary splice in accordance with the present invention is shown in FIG. 2. A first or input fiber 202 is a linear polarization-maintaining fiber and is spliced with a high birefringent polarization-maintaining second or retardation fiber 204 such that the polarization axes 208 of retardation fiber 204 are oriented at 45° with respect to the polarization axes 206 of input fiber 202.

Figure 3:
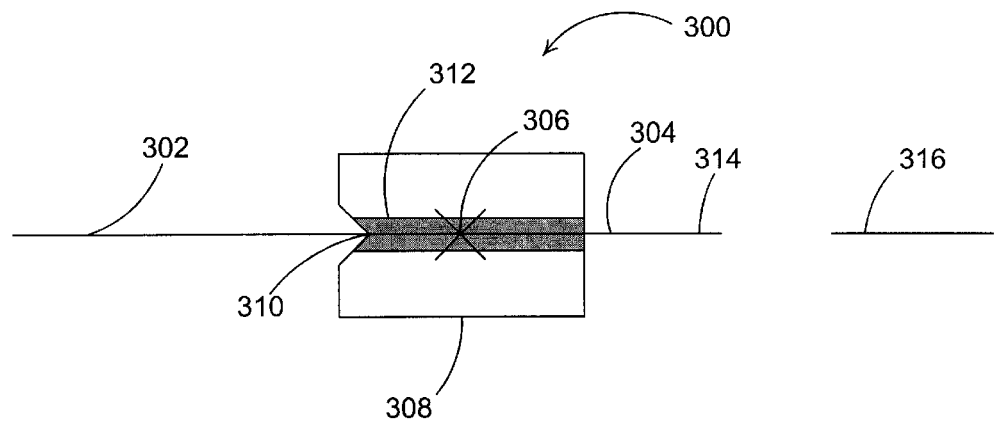
FIG. 3 shows an exemplary embodiment of a polarization-maintaining fiber having a polarization-maintaining retardation fiber spliced therein.
Figure 4:
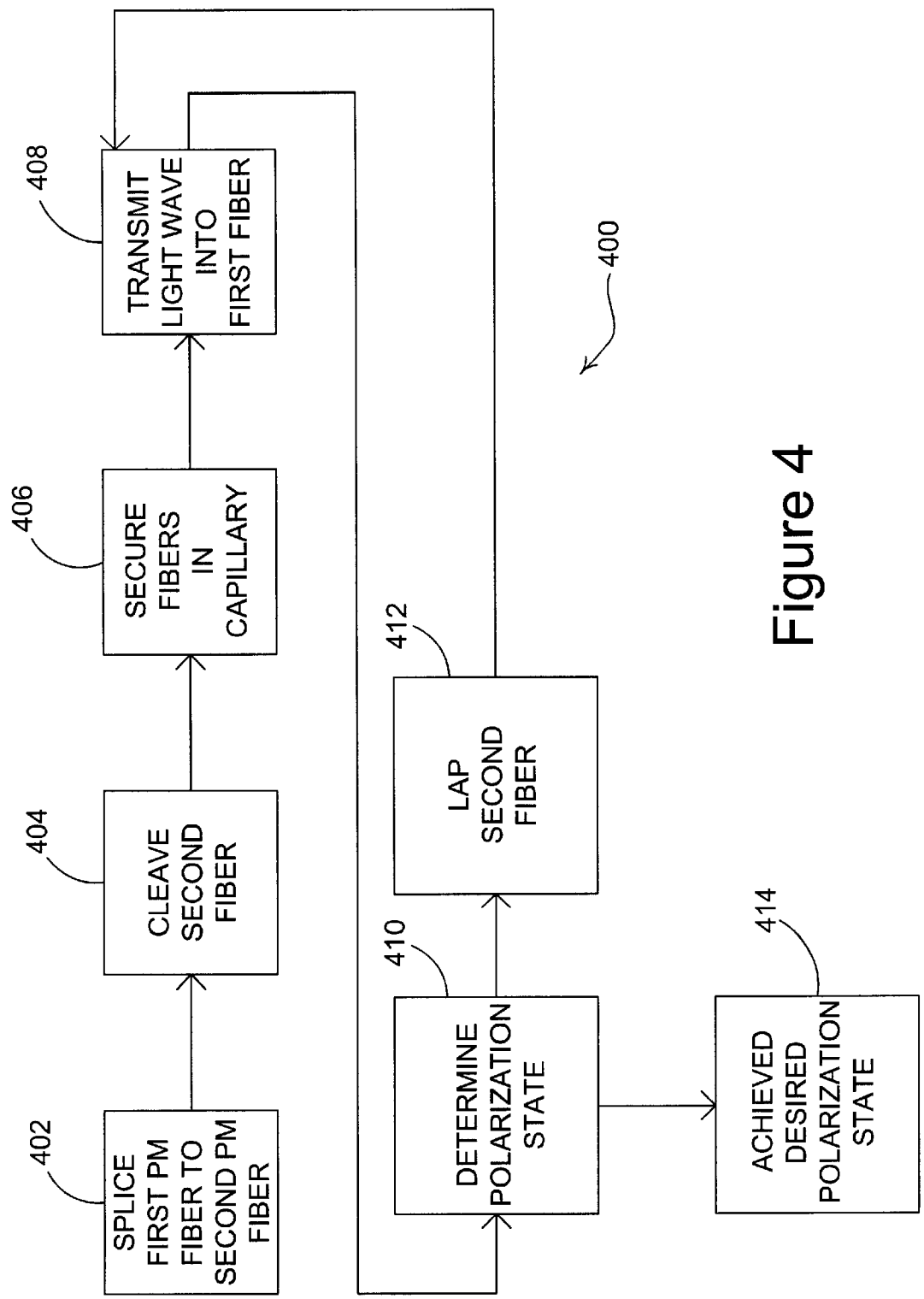
FIG. 4 shows a flow chart of an exemplary method for converting a wave from a linear polarization state to a circular polarization state via a polarization-maintaining fiber having a long beat length.

An exemplary embodiment and method in accordance with the present invention are shown in FIGS. 3 & 4. A first or input fiber 302 and a second or retardation fiber 304 are linear polarization-maintaining fibers. Input fiber 302 has a short beat length which is typically less than three millimeters per wavelength of retardation. Retardation fiber 304 has a longer beat length, suitably at least four millimeters per wavelength of retardation.

Beat length is the length of fiber which corresponds to one wavelength of retardation between two light waves, each traveling along a different polarization axis of the fiber. In a typical polarization-maintaining fiber, one millimeter corresponds to one wavelength of retardation. In general, the applications for the fiber are such that the goal is to minimize the length of the fiber to achieve a desired retardation. This corresponds to the difference, $n_x-n_y$, being as large as possible. However, in accordance with one aspect of the present invention, the retardation fiber suitably has an increased beat length so that a retardation fiber is more manageable to manipulate. A retardation fiber that has one wavelength of retardation per four or five millimeters of fiber is much easier to manipulate than a retardation fiber that has one wavelength of retardation over one millimeter of fiber. For example, assume it is desirable to retard a component of a light wave by 90°, i.e., one-quarter of a wavelength. If a retardation fiber having a beat length of one millimeter was used, it would be necessary to cut the fiber to a length equal to one quarter of one millimeter. On the other hand, if a four millimeter beat length retardation fiber was used, it would be necessary to cut the fiber to a length equal to one millimeter, which is a much more manageable operation. A retardation fiber is suitably selected to be a length which is short enough to maintain its polarization-maintaining characteristics and long enough to make it practical to handle and cleave.

As discussed above, retardation fiber 304 is designed to convert polarization states of a light wave. As shown in FIGS. 3 & 4, in an exemplary method 400 of the present invention, retardation fiber 304 is connected at splice 306 using fusion splicing, or some other method now known or later discovered, to input fiber 302 (step 402) such that their polarization axes are oriented at 45° with respect to each other (as shown in FIG. 2). Retardation fiber 304 is then cleaved at end 314 to a length from splice 306 that is slightly longer than that which will give the desired retardation (step 404). An exemplary retardation fiber has a beat length of four millimeters, i.e., four millimeters of retardation fiber 304 corresponds to one wave length of retardation. To achieve 90° or quarter-wave retardation, the optimal length of retardation fiber 304 is one quarter of four millimeters or one millimeter. Thus, in this exemplary method, retardation fiber 304 is cleaved to slightly more than one millimeter, e.g., one-and-one-half millimeters. Once cleaved, the remaining retardation fiber 304 is secured in a glass capillary 308 (step 406). A substance 312, such as wax, may be inserted between retardation fiber 304 and glass capillary 308 if it is desirable to remove glass capillary 308 later. More specifically, wax may be placed on input fiber 302 at an edge 310 of glass capillary 308 such that the wax wicks along input fiber 302 and retardation fiber 304 through capillary 308. Alternatively, substance 312 may be a more permanent adhesive used to affix capillary 308 to input fiber 302 and retardation fiber 304 if it is desirable to have fiber 304 remain in capillary 308. Polarized light is then transmitted into input fiber 302 (step 408). The output of retardation fiber 304 is input into a polarization detector and analyzer (not shown) to determine the polarization state of light emitted from retardation fiber 304 (step 410). If the polarization state of the emitted light is sufficiently close to circular, the method is complete (step 414). If the polarization state of the emitted light is not sufficiently close to circular, cleaved end 314 of retardation fiber 304 is lapped with an abrasive substance (step 412) commonly known in the art. The abrasive substance is used to slightly decrease the length of retardation fiber. The slight decrease may amount to a fraction of a beat length, for example.

Polarized light is then again transmitted into input fiber 302 (step 408) and step 410 is repeated. If the polarization state of the emitted light is sufficiently close to circular, the method is complete (step 414). If the polarization state of the emitted light is not sufficiently close to circular, the retardation fiber 304 is again lapped with the abrasive substance (step 412). These steps are repeated until the desired result, i.e., a circular polarization state, is obtained. The cleaving and lapping steps need to be executed with extreme accuracy. If retardation fiber 304 is cleaved or lapped too short, a new retardation fiber may be necessary because the desired polarization state may no longer be obtained. Thus, precision is important in cleaving retardation fiber 304.

Once the desired polarization state is obtained, an output fiber 316 may then be joined to end 314 of retardation fiber 304 via a splice or some other suitable means. Typically, output fiber 316 is an end of a sensing coil. In addition, output fiber 316 suitably preserves circular polarization states.

Figure 5:
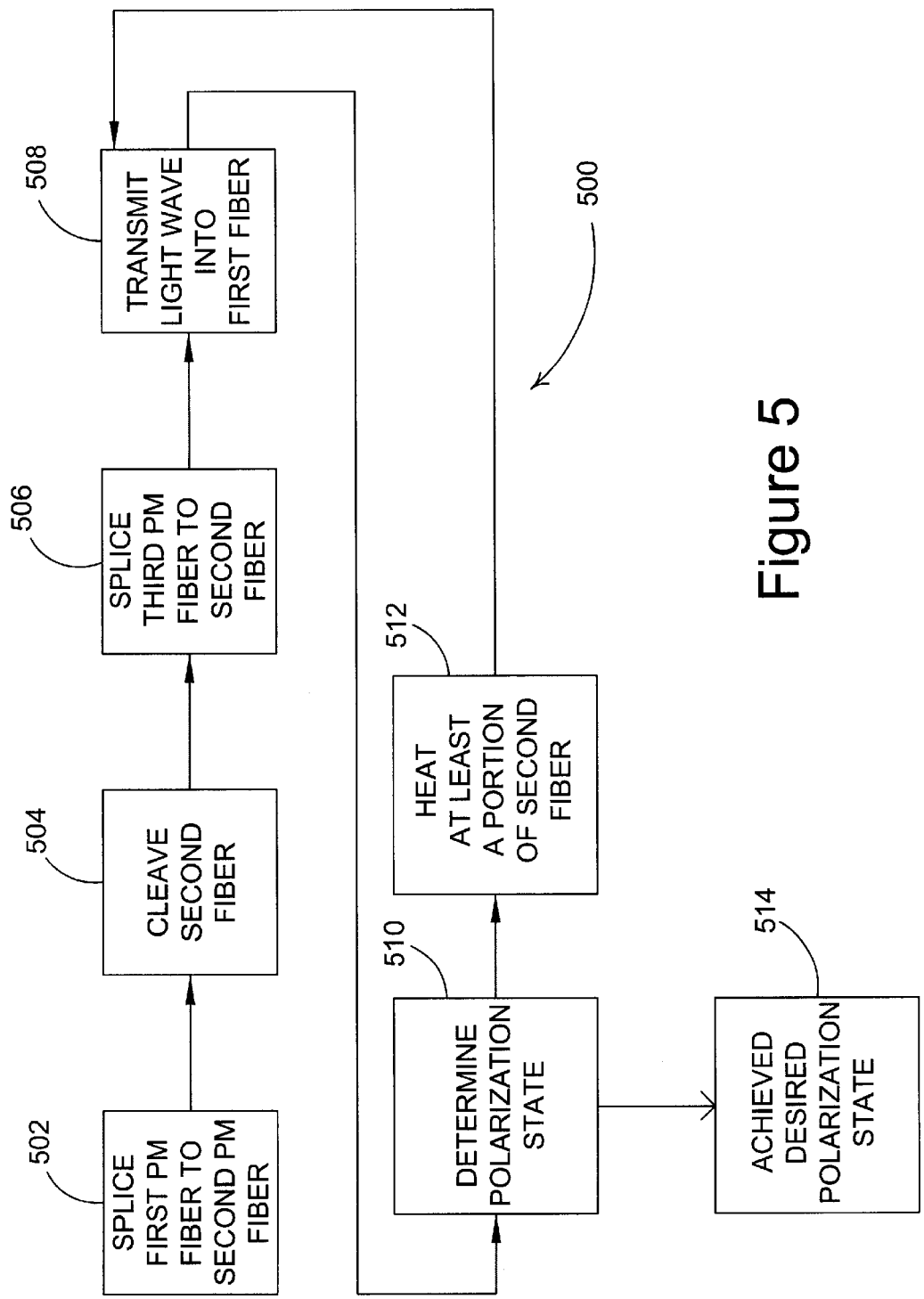
FIG. 5 shows a flow chart of an alternate exemplary method for converting a wave from a linear polarization state to a circular polarization state by heating a polarization-maintaining retardation fiber.

In an alternate exemplary method 500 in accordance with the present invention, as shown in FIGS. 2 & 5, input fiber 202 is spliced to retardation fiber 204 such that their polarization axes are oriented at 45° with respect to each other (step 502). Input fiber 202 and retardation fiber 204 are suitably linear polarization-maintaining fibers. Retardation fiber 204 is then cleaved at a length from the splice that is slightly more than that which will give the desired retardation as discussed above (step 504). A third or output fiber 210 may then be spliced to an end of retardation fiber 204 (step 506). The above connection of input fiber 202, retardation fiber 204 and output fiber 210 may be done in any sequence. Polarized light is then transmitted into input fiber 202 (step 508). The output of output fiber 210 is transmitted into a polarization analyzer and detector to determine the polarization state of light emitted from output fiber 210 (step 510). If the polarization state of emitted light is sufficiently close to circular, the method is complete (step 514). If the polarization state of emitted light is not sufficiently close to circular, either all of or a part of retardation fiber 204 is then heated (step 512). Retardation fiber 204 may be heated with a low power fusion splicer arc, a flame or any other suitable means. Heating retardation fiber 204 will reduce its internal stresses, thereby increasing the beat length of retardation fiber 204 and reducing the polarization retardation. Polarized light is then again transmitted into input fiber 202 (step 508) and the output of output fiber 210 is transmitted into a polarization analyzer and detector to determine the polarization state of light emitted from output fiber 210 (step 510). If the polarization state of emitted light is sufficiently close to circular, the method is complete (step 514). If the polarization state of emitted light is not sufficiently close to circular, retardation fiber 204 is again heated to change the polarization retardation (step 512), and the sequence is repeated.

In this exemplary method, the beat length of retardation fiber 204 is less critical than in other methods because the heating of retardation fiber 204 provides for a greater tolerance in the cleaved length of retardation fiber 204.

Figure 6:
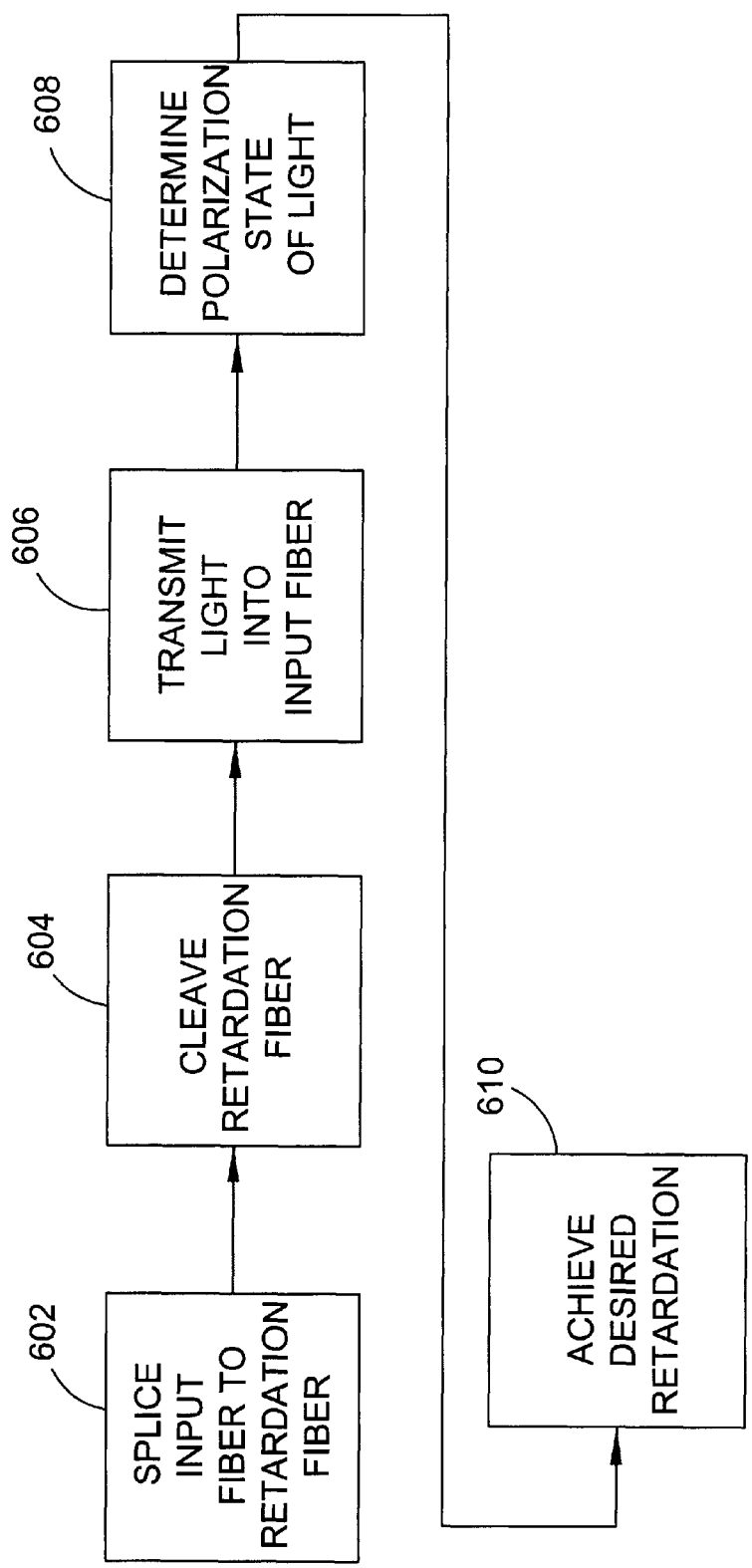
FIG. 6 shows a flow chart of an alternate exemplary method for converting light from a linear polarization state to a circular polarization state by cleaving a long beat length polarization-maintaining retardation fiber to a desired length.

In an alternate exemplary method 600 in accordance with the present invention shown in FIGS. 2 & 6, input fiber 202 and retardation fiber 204 are suitably linear polarization-maintaining fibers. Input fiber 202 has a short beat length which is typically less than three millimeters per wavelength of retardation. Retardation fiber 204 has a longer beat length which is preferably at least four millimeters per one wavelength of retardation. Retardation fiber 204 is spliced to input fiber 202 (step 602) using fusion splicing techniques or some other suitable method now known or later discovered such that their polarization axes are oriented at 45° with respect to each other. Retardation fiber 204 is then cleaved at a length from the splice which will yield a desired retardation (step 604). Such precise cleaving may be performed using the following steps:

a) clamp the input fiber into a holding fixture, b) cleave the input fiber a controlled distance, B, from the holding fixture, c) splice the input and retardation fibers together, and d) cleave the retardation fiber at a second distance, B+B, from the holding fixture.

An alternate method for precise cleaving may be performed by the following steps:

a) clamp the input fiber into a holding fixture, b) cleave the input fiber a controlled distance, B, from its holding fixture, c) splice the input and retardation fibers together, d) clamp the retardation fiber in a holding fixture, e) release the clamp on the input fiber, f) move the input fiber holding fixture the desired distance, d, closer to the retardation fiber holding fixture, g) again clamp the input fiber into its holding fixture, and h) cleave the retardation fiber at the controlled distance, B, from the input fiber holding fixture.

Polarized light is then transmitted into input fiber 202 (step 606). The output of retardation fiber 204 is transmitted into a polarization analyzer and detector to determine the polarization state of the light emitted from retardation fiber 204 (step 608). In this exemplary method, because the initial cleave of retardation fiber 204 occurs at a length so near the length which will yield the desired retardation, no additional modifications to the length of retardation fiber 204 are made.

Although the above exemplar, methods are all oriented towards converting the polarization of light waves from linear to circular, the present invention is not so limited. The methods may be used to convert any polarization state to any other polarization state by the orientation of input fiber to retardation fiber, the length and beat length of retardation fiber and the techniques for adjusting the length of the retardation fiber. For example, if a desired retardation is 180° or one-half of a wavelength, the above techniques can be used to achieve the desired retardation.

In addition, as stated above, the present invention is useful in all optics applications in which a change of polarization state of a light wave is desirable.

Irrespective of which method disclosed herein is used to convert the polarization state of a light wave, the splices may be rejacketed or packaged in a rigid housing as is known in the industry.

It will be understood that the foregoing description is of exemplary embodiments and methods of this invention and that this invention is not so limited. Various modifications may be made in the design, arrangement, and implementation of these embodiments and methods without departing from the spirit and scope of the present invention, as set forth in the claims below.

What is claimed is:

1. A method for making a retarding polarization fiber segment for a light wave to obtain a desired polarization state, said method comprising the steps of:

(a) clamping, by way of a first clamp, an input optical fiber, having first and second ends, to an input fiber holding fixture establishing a first reference plane substantially transverse to said input optical fiber;

(b) cleaving said input optical fiber at said first end a controlled distance B away from said reference plane;

(c) splicing a retardation fiber to said first end of said input optical fiber;

(d) clamping, by way of a second clamp, said retardation fiber to a second holding fixture in fixed relation to said first input fiber holding fixture, and there being a second reference plane transverse to said second holding fixture;

(e) releasing said first clamp on said input optical fiber;

(f) moving said input fiber holding fixture a selected distance D, relative to said second holding fixture, to achieve a desired delay line;

(g) clamping said input optical fiber to said input fiber holding fixture; and (h) cleaving said retardation fiber at said controlled distance B away from said first reference plane.

* * * * *